United States Patent
Xie et al.

(10) Patent No.: US 10,444,914 B2
(45) Date of Patent: Oct. 15, 2019

(54) TOUCH STRUCTURE AND PREPARATION METHOD THEREFOR, TOUCH SUBSTRATE, AND DISPLAY DEVICE

(71) Applicants: BOE Technology Group Co., Ltd., Beijing (CN); Hefei Xinsheng Optoelectronics Technology Co., Ltd., Hefei (CN)

(72) Inventors: Xiaodong Xie, Beijing (CN); Ming Hu, Beijing (CN); Ming Zhang, Beijing (CN); Jing Wang, Beijing (CN); Min He, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/517,617

(22) PCT Filed: Feb. 3, 2016

(86) PCT No.: PCT/CN2016/073283
§ 371 (c)(1),
(2) Date: Apr. 7, 2017

(87) PCT Pub. No.: WO2017/045341
PCT Pub. Date: Mar. 23, 2017

(65) Prior Publication Data
US 2017/0308201 A1    Oct. 26, 2017

(30) Foreign Application Priority Data
Sep. 18, 2015    (CN) .......................... 2015 1 0597119

(51) Int. Cl.
*G06F 3/045*    (2006.01)
*G06F 3/041*    (2006.01)
(Continued)

(52) U.S. Cl.
CPC ............ *G06F 3/044* (2013.01); *G06F 3/0412* (2013.01); *G06F 3/0416* (2013.01);
(Continued)

(58) Field of Classification Search
CPC ....... G06F 3/044; G06F 3/0412; G06F 3/0416
See application file for complete search history.

(56) References Cited

U.S. PATENT DOCUMENTS

2011/0128240 A1*  6/2011  Choi .......................... G02F 1/13
                                                            345/173
2011/0181542 A1*  7/2011  Yang ....................... G06F 3/044
                                                            345/174
(Continued)

FOREIGN PATENT DOCUMENTS

CN          102156563 A       8/2011
CN          102799313 A       11/2012
(Continued)

OTHER PUBLICATIONS

Jun. 14, 2016—(WO) International Search Report and Written Opinion Appn PCT/CN2016/073283 with English Tran.
(Continued)

*Primary Examiner* — Nan-Ying Yang
(74) *Attorney, Agent, or Firm* — Banner & Witcoff, Ltd.

(57) ABSTRACT

A touch structure includes a base substrate, an insulating layer disposed thereon, a first touch electrode and a second touch electrode intersecting each other, and a first signal transmission structure electrically connected with the first touch electrode. The insulating layer includes a first section that is disposed at the intersecting position of the first touch electrode and the second touch electrode and is located between the first touch electrode and the second touch electrode to insulate same from each other, and a second (Continued)

section that is disposed at the same layer as the first section and covers the first signal transmission structure.

15 Claims, 10 Drawing Sheets

(51) Int. Cl.
*G06F 3/044* (2006.01)
*H01L 27/32* (2006.01)
(52) U.S. Cl.
CPC .............. *G06F 2203/04103* (2013.01); *G06F 2203/04111* (2013.01); *H01L 27/323* (2013.01)

(56) References Cited

U.S. PATENT DOCUMENTS

| | | | | |
|---|---|---|---|---|
| 2011/0193801 A1* | 8/2011 | Jung | ................... | G06F 3/0412 345/173 |
| 2013/0181921 A1* | 7/2013 | Kuwajima | .............. | G06F 3/041 345/173 |
| 2013/0257786 A1* | 10/2013 | Brown | ................... | G06F 3/044 345/174 |
| 2014/0035833 A1* | 2/2014 | Gorsica | ................... | G06F 3/041 345/173 |
| 2014/0069796 A1 | 3/2014 | Kang et al. | | |

FOREIGN PATENT DOCUMENTS

| | | |
|---|---|---|
| CN | 103218073 A | 7/2013 |
| CN | 103389819 A | 11/2013 |
| CN | 104571759 A | 4/2015 |
| CN | 105159515 A | 12/2015 |

OTHER PUBLICATIONS

Jul. 25, 2017—(CN) First Office Action Appn 201510597119.6 with English Tran.

* cited by examiner

TOUCH STRUCTURE AND PREPARATION METHOD THEREFOR, TOUCH SUBSTRATE, AND DISPLAY DEVICE

The application is a U.S. National Phase Entry of International Application No. PCT/CN2016/073283 filed on Feb. 3, 2016, designating the United States of America and claiming priority to Chinese Patent Application No. 201510597119.6 filed on Sep. 18, 2015. The present application claims priority to and the benefit of the above-identified applications and the above-identified applications are incorporated by reference herein in their entirety.

TECHNICAL FIELD

Embodiments of the present disclosure relate to a touch structure, a manufacturing method thereof, a touch substrate and a display device.

BACKGROUND

Capacitive touch panels are widely applied due to advantages such as precise and sensitive positioning, good touch feeling, and long service life, etc.

One glass solution (OGS) touch panels and on-cell touch panels are two common types of touch panels. An OGS touch panel is formed by forming a touch substrate by arranging a touch structure on a protective substrate on the outside of a display panel, and subsequently bonding the touch substrate and the display panel. In an on-cell touch panel, a touch structure is disposed on a surface of an opposing substrate (e.g., a color filter (CF) substrate) in a display panel that is away from an array substrate.

In a manufacturing process of the OGS touch panel and the on-cell touch panel, a photolithography process is usually adopted to manufacture products with superior performances, but the photolithography process inevitably needs to use masks. A mask has high requirement on manufacture accuracy, a high use repetition rate, and a very expensive price. If the number of masks can be reduced as much as possible in the design of a product and performance of the product can also be satisfied, a production cost, a tact time of a single product and the like can be greatly reduced, and utilization of devices can also be obviously improved.

SUMMARY

At least an embodiment of the present disclosure provides a touch structure, a manufacturing method thereof, a touch substrate and a display device, which can reduce a quantity of masks used by changing the sequence of manufacturing processes.

At least an embodiment of the disclosure provides a touch structure, which includes a base substrate, an insulating layer disposed on the base substrate, a first touch electrode, a second touch electrode and a first signal transmission structure. The first touch electrode and the second touch electrode intersect with each other; the insulating layer includes a first section, the first section is disposed at a position where the first touch electrode intersects with the second touch electrode, and the first section is arranged between the first touch electrode and the second touch electrode to insulate the first touch electrode from the second touch electrode. The first signal transmission structure is electrically connected with the first touch electrode. The insulating layer further includes a second section arranged in a same layer as the first section, and the second section covers the first signal transmission structure.

At least an embodiment of the disclosure provides a touch substrate, comprising the above touch structure.

At least an embodiment of the disclosure provides a display device, comprising the above touch substrate.

At least an embodiment of the disclosure provides a manufacturing method for a touch structure, comprising: forming, on a base substrate, a first touch electrode and a second touch electrodes which intersect with each other; forming a first signal transmission structure on the base substrate, where the first signal transmission structure is electrically connected with the first touch electrode; and forming an insulating film after forming the first signal transmission structure, and patterning the insulating film to form an insulating layer including a first section and a second section. In the method, the first section is formed at a position where the first touch electrode intersects with the second touch electrode, the first section is disposed between the first touch electrode and the second touch electrode to insulate the first touch electrode from the second touch electrode, and the second section covers the first signal transmission structure.

BRIEF DESCRIPTION OF THE DRAWINGS

In order to illustrate the technical solutions in embodiments of the present disclosure more clearly, the drawings need to be used in the description of embodiments will be briefly described in the following; it is obvious that the drawings described below are only related to some embodiments of the present disclosure, and are not intended to limit the scope of the disclosure.

FIG. 1b is a schematic sectional view along a BB line in FIG. 1a;

FIG. 1c is a schematic sectional view along a CC line in FIG. 1a;

DETAILED DESCRIPTION

Hereafter, the technical solutions of embodiments of the present disclosure will be described in a clearly and fully understandable way in connection with the drawings related to embodiments of the disclosure. It is obvious that the described embodiments are just a part but not all of embodiments of the present disclosure. Based on embodiments of the present disclosure, all other embodiments obtained by those skilled in the art without making other inventive work should be within the scope of the present disclosure.

Unless otherwise clearly defined, technological terms or scientific terms used in the disclosure have common meanings understood by persons of ordinary skills in a field that the disclosure belongs to. In the present disclosure, terms such as "first", "second" and the like used in the present disclosure do not indicate any sequence, quantity or significance but only for distinguishing different constituent parts. The terms "comprises," "comprising," "includes," "including," etc., are intended to specify that the elements or the objects stated before these terms encompass the elements or the objects and equivalents thereof listed after these terms, but do not preclude the other elements or objects. Terms such as "coupled", "connected" should be broadly interpreted, for example, it may be fixedly connected, or may be detachably connected, or integrally connected; it may be mechanically connected, or may be electrically connected; it may be directly connected, or may be indirectly connected via an intermediate medium. Terms such as "up," "down," "left," "right" and so on, are used to indicate relative positional relationships. When an absolute position of a described object changes, a relative positional relationship of the object also changes possibly.

Figure 1A:
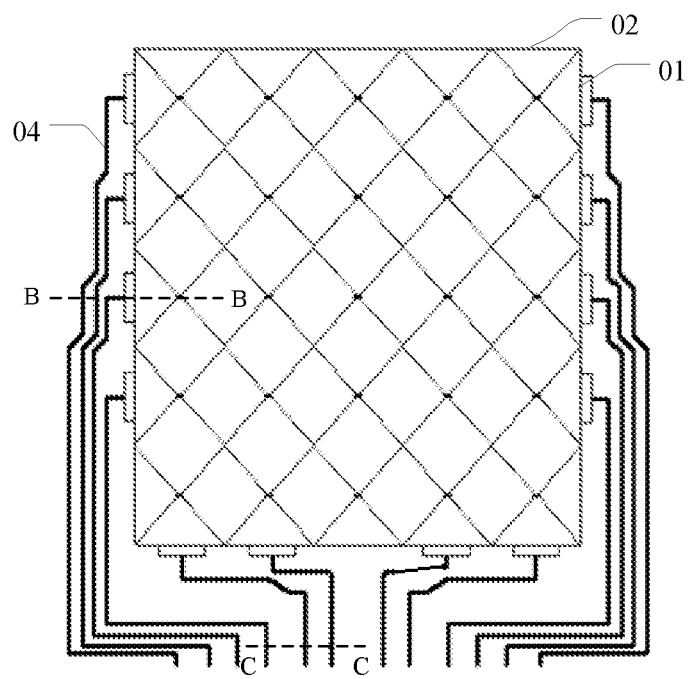
FIG. 1a is a schematic top view of a conductive bridge touch structure.
Figure 1B:
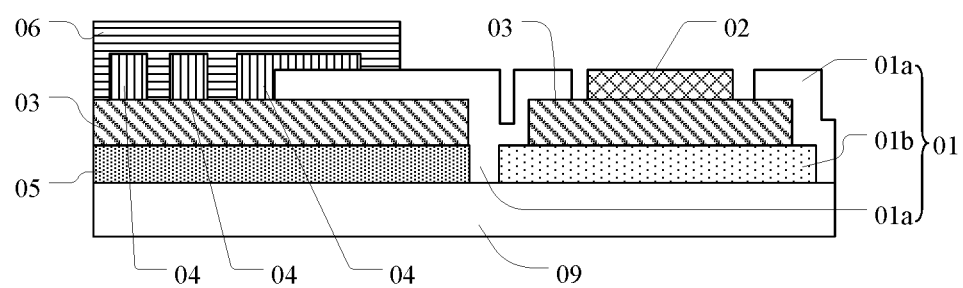

In a capacitive touch panel, a conductive bridge touch structure is a common type of touch structures. FIG. 1a is a schematic top view of a conductive bridge touch structure. As illustrated in FIG. 1a, the touch structure comprises a plurality of first touch electrodes 01 and a plurality of second touch electrodes 02 which are crisscrossed with each other. Each of the first touch electrodes 01 and the touch electrodes 02 are electrically connected with at least one wire 04, so as to be electrically connected with a touch chip (not shown in FIG. 1a). In general, if an OGS touch panel adopts the conductive bridge touch structure, a 6-mask process is generally used, namely 6 masks needs to be used. FIG. 1b is a schematic sectional view along a BB line in FIG. 1a. As illustrated in FIG. 1b, the 6-mask process may generally include the following steps (1) to (6).

Step (1): Forming a black matrix (BM) layer 05 on a base substrate 09. For instance, the BM layer may be obtained by a patterning process including coating, exposure and development.

Step (2): Forming a conductive layer. For instance, the conductive layer may include a plurality of conductive bridges 01b that are disposed at intervals. For instance, the conductive layer may be made from transparent conductive materials such as indium tin oxide (ITO). For instance, the conductive layer may be obtained by a patterning process including sputter coating, photoresist coating, exposure, development, etching, and photoresist stripping, etc.

Step (3): Forming a first insulating layer 03, with the first insulating layer 03 covering the conductive bridges 01b. For instance, the first insulating layer 03 may be obtained by a patterning process including coating, exposure and development.

Step (4): Forming a transparent conductive layer, where the transparent conductive layer includes a second touch electrode 02 and a plurality of sub-electrodes 01a that are disposed at intervals. Adjacent sub-electrodes 01a are electrically connected with each other through the conductive bridges 01b to form a first touch electrode 01. For instance, the transparent conductive layer may also be obtained by a patterning process including sputter coating, photoresist coating, exposure, development, etching, and photoresist stripping, etc.

Step (5): Forming a signal transmission layer. For instance, the signal transmission layer includes a plurality of wires 04 which are respectively electrically connected with the first touch electrodes 01 or the second touch electrodes 02. FIG. 1b only illustrates an electrical connection between a first touch electrode 01 and a wire 04. The electrical connection approach of a second touch electrode 02 and a wire 04 is similar to that of the first touch electrode 01. The forming process of the signal transmission layer may be similar to the forming process of the first and second transparent conductive layers.

Step (6): forming a second insulating layer 06, where the second insulating layer 06 covers the wires 04 and is configured to protect the wires 04. The forming process of the second insulating layer 06 may be similar to the forming process of the first insulating layer 03.

Figure 1C:
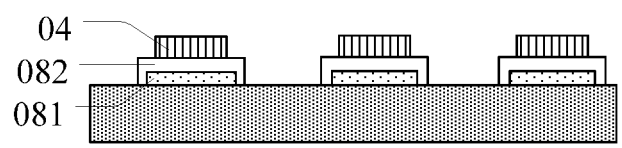

Inventors of the application have noticed in research that: the number of the masks used may be reduced by changing the process order of the above 6-mask process, so that the production cost can be reduced; and in the 6-mask process, an undercut phenomenon tends to occur to the wires 04 at positions where the wires 04 are electrically connected with the touch chip (namely at bonding positions), leading to wire disconnections. FIG. 1c is a schematic sectional view along a CC line in FIG. 1a. As illustrated in FIG. 1c, 081 represents a retaining part of the conductive layer at the bonding position, namely the retaining part 081 is arranged in the same layer as the conductive bridge 01b; 082 represents a retaining part of the transparent conductive layer at the bonding position, namely the retaining part 082 is arranged in the same layer as the second touch electrode 02 and the sub-electrode 01a; and the wire 04 is formed on the retaining parts 081 and 082. In this case, an undercut phenomenon tends to occur to the wire 04.

At least one embodiment of the present disclosure provides a touch structure, a manufacturing method thereof, a touch substrate and a display device, which adopt an insulating layer between first touch electrodes and second touch electrodes to cover first signal transmission structures that are electrically connected with the first touch electrodes, do not need to independently form a protective layer for the first signal transmission structures, and hence can save a mask used in the step of independently forming the protective layer for the first signal transmission structures.

Figure 2:
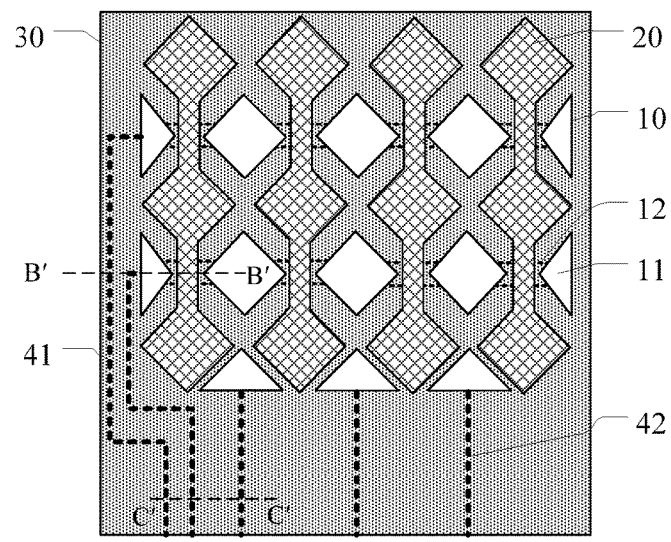
FIG. 2 is a schematic top view of a touch structure provided by an embodiment of the present disclosure.

At least one embodiment of the present disclosure provides a touch structure. As illustrated in FIGS. 2 to 3d, the touch structure comprises a base substrate 90, and an insulating layer 30, first touch electrodes 10, second touch electrodes 20 and first signal transmission structures 41 which are disposed on the base substrate 90. The first touch electrodes 10 and the second touch electrodes 20 intersect with each other. Description is given in FIG. 2 by taking the case that the first touch electrodes 10 extend along a transverse direction and the second touch electrodes 20 extend along a longitudinal direction as an example. Of course, the extending directions of the first touch electrodes and the second touch electrodes may also be exchanged or be other directions. The insulating layer 30 includes first sections 31. A first section 31 is disposed at a position where a first touch electrode 10 intersects with a second touch electrode 20, with the first section 31 being arranged between the first touch electrode 10 and the second touch electrode 20 so as to insulate the first touch electrode 10 from the second touch electrode 20. The first signal transmission structures 41 are electrically connected with the first touch electrodes 10. The insulating layer 30 further includes second sections 32 arranged in the same layer with the first sections 31. Each second section 32 covers corresponding first signal transmission structures 41; that is, the second section 32 is disposed on the corresponding first signal transmission structures 41, and an orthographic projection of the second section 32 on a surface provided with the corresponding first signal transmission structures 41 overlaps with the corresponding first signal transmission structures 41.

In FIG. 2, dotted lines represent that corresponding structures are covered by the insulating layer 30, and solid lines represent that corresponding structures are not covered by the insulating layer 30.

It should be noted that: in the present disclosure, the arrangement of the first sections 31 and the second sections 32 in the same layer indicates that the first sections 31 and the second sections 32 are formed by the same film layer. For instance, the first sections 31 and the second sections 32 may be formed by forming an insulating film at first and then patterning the insulating film to construct the first sections 31 and the second sections 32. The first sections 31 and the second sections 32 may be disposed separately from each other, or at least part of the first sections and part of the second sections 32 may be connected with each other. In the following embodiments of the present disclosure, "arrangement in the same layer" indicates that related elements are formed by the same layer.

In addition, FIGS. 3a to 3d illustrate a plurality of first signal transmission structures 41. Each first signal transmission structure 41 may be electrically connected with one first touch electrode 10. Description is given in FIGS. 3a to 3d by taking the electrical connection between one first signal transmission structure 41 and one first touch electrode 10 as an example.

The insulating layer 30 is configured to insulate the first touch electrodes 10 from the second touch electrodes 20 and may protect the first signal transmission structures 41 from being oxidized and scratched. Materials of the insulating layer 30 may include organic materials such as resin or may include inorganic materials such as silicon dioxide, silicon nitride and silicon oxynitride, etc.

For instance, a forming material of the first signal transmission structures 41 may include a metal, e.g., at least one of copper, aluminum, magnesium, molybdenum, zirconium, titanium, lead and the like or an appropriate alloy of the metals thereof. For instance, each first signal transmission structure 41 may include at least one of a wire or a contact pad.

For instance, a forming material of the first touch electrodes 10 and the second touch electrodes 20 may include a transparent conductive metal oxide, e.g., at least one of ITO, indium gallium zinc oxide (IGZO), or indium zinc oxide (IZO), etc.

Figure 3A:
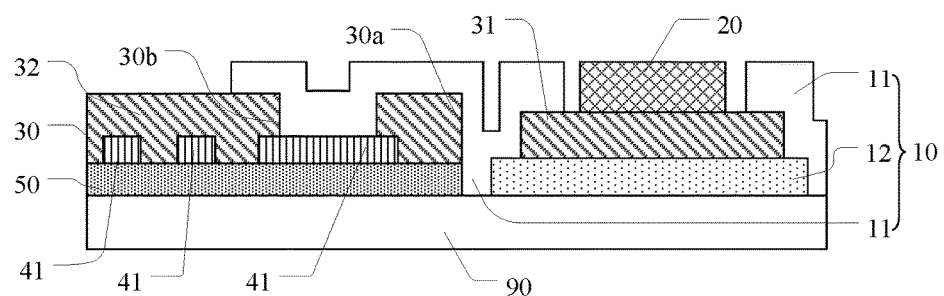
FIGS. 3a to 3d are schematic sectional views of a conductive bridge touch structure along a B'B' line in FIG. 2 provided by an embodiment of the present disclosure.
Figure 3B:
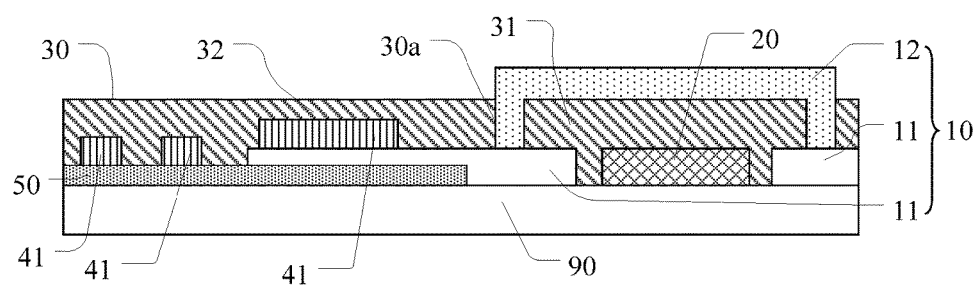
Figure 3C:
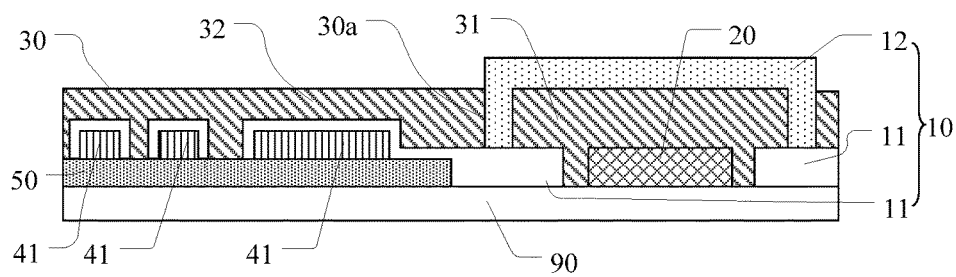
Figure 3D:
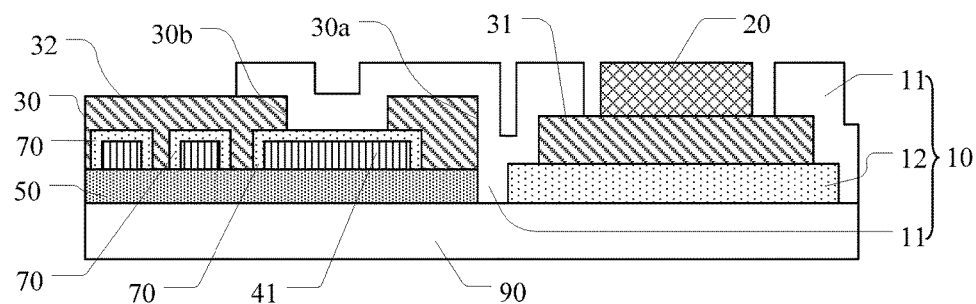

A part of the first touch electrode 10 that is electrically connected to the first signal transmission structure 41 (a sub-electrode 11 of the first touch electrode 10 that is directly and electrically connected with the first signal transmission structure 41 as shown in FIGS. 3a and 3b) may be disposed on a side of the insulating layer 30 that is away from the base substrate 90; that is, the first touch electrode 10 may include a part which is directly connected with the first signal transmission structure 41 and arranged on one side of the insulating layer 30 that is away from the base substrate 90. Or, the part of the first touch electrode 10 that is directly and electrically connected with the first signal transmission structure 41 may also be disposed on a side of the insulating layer 30 that is close to the base substrate 90, and may also be arranged between the insulating layer 30 and the first signal transmission structures 41 (as shown in FIG. 3c). Or, the part of the first touch electrodes 10 that is directly and electrically connected with the first signal transmission structure 41 may also be disposed on a side of the insulating layer 30 that is close to the base substrate 90, and may also be arranged between the first signal transmission structures 41 and the base substrate 90 (as shown in FIG. 3b).

Figure 4:
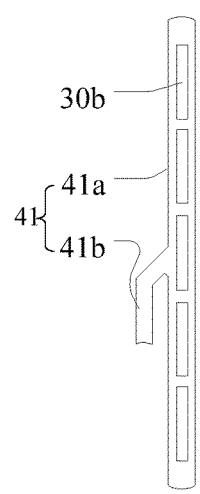
FIG. 4 is a schematic top view of a plurality of through holes formed at an area provided with a first signal transmission structure in an embodiment of the present disclosure.

When the part of the first touch electrode 10 that is electrically connected with the first signal transmission structure 41 is disposed on a side of the insulating layer 30 that is away from the base substrate 90, for instance, the first signal transmission structure 41 may be electrically connected with the first touch electrode 10 via at least one through hole 30b formed in the second section 32 of the insulating layer 30. FIGS. 3a and 3d only illustrate that the first signal transmission structure 41 is electrically connected with the first touch electrode 10 via one through hole 30b. FIG. 4 illustrates that the first signal transmission structure 41 is electrically connected with the first touch electrode (not shown in FIG. 4) via a plurality of through holes 30b. As illustrated in FIG. 4, the first signal transmission structure 41 includes a contact pad 41a and a wire 41b (FIG. 4 only shows one part of the wire 41b) which are integrally formed, and the plurality of through holes 30b are formed at an area provided with the contact pad 41a.

In an embodiment of the present disclosure, as the first signal transmission structure 41 is electrically connected with the first touch electrode 10 (or the second touch electrode 20) via a plurality of through holes 30b, a risk of overall disconnection due to the peeling phenomenon of the first touch electrode 10 (or the second touch electrode 20) at the through holes 30b can be reduced.

For instance, the touch structure provided by an embodiment of the present disclosure may adopt a conductive bridge touch structure. That is to say, as shown in FIGS. 2 to 3d, one of the first touch electrode 10 and the second touch electrode 20 may include at least one conductive bridge and a plurality of sub-electrodes that are separated from each other; two adjacent sub-electrodes are electrically connected with each other through a conductive bridge; the conductive bridge is disposed at a position where the first touch electrode intersects with the second touch electrode; and the other one of the first touch electrode and the second touch electrode is arranged in the same layer as the sub-electrodes but is arranged in a different layer from the conductive bridge. For instance, as shown in FIGS. 3a to 3d, the first touch electrode 10 includes at least one conductive bridge 12 and a plurality of sub-electrodes 11 that are separated from each other (FIGS. 3a and 3b only show one conductive bridge 12 and two sub-electrodes 11); adjacent sub-electrodes 11 are electrically connected with each other through the conductive bridge 12, that is, each sub-electrode 11 is electrically connected with a corresponding conductive bridge 12 via a through hole 30a in the insulating layer 30; and the second touch electrode 20 is arranged in the same layer with the sub-electrodes 11 but is arranged in a different layer from the conductive bridge 12. Description is given in FIGS. 3a to 3d by only taking the case that the first touch electrode 10 includes the sub-electrodes 11 and the conductive bridge 12 as an example. But the present disclosure is not limited to the structure thereto.

The sub-electrodes 11 and the conductive bridge 12 may be respectively disposed on any two sides of the insulating layer 30 (that is, a side facing the base substrate 90 and another side that is away from the base substrate 90). For instance, as shown in FIGS. 3a and 3d, the conductive bridge 12 is disposed between the first section 31 of the insulating layer 30 and the base substrate 90, and the sub-electrodes 11 are disposed on a side of the insulating layer 30 that is away from the base substrate 90. Or, for instance, as shown in FIGS. 3b and 3c, the conductive bridge 12 is disposed on another side of the insulating layer 30 that is away from the base substrate 90, and the sub-electrodes 11 are disposed between the insulating layer 30 and the base substrate 90.

For instance, as shown in FIG. 2, the touch structure provided by an embodiment of the present disclosure may further comprise second signal transmission structures 42. The second signal transmission structures 42 are electrically connected with the second touch electrodes 20, so as to achieve electrical connection between the second touch electrodes and the touch chip. For instance, the second signal transmission structures 42 may be arranged in the same layer with the first signal transmission structures 41.

In a case that the touch structure adopts the conductive bridge touch structure, for instance, as shown in FIGS. 3a to 3d, as the second touch electrodes 20 are arranged in the same layer with the sub-electrodes 11 of the first touch electrodes 10, when the first signal transmission structures 41 and the second signal transmission structures 42 are arranged in the same layer, an electrical connection approach between the second touch electrodes 20 and the second signal transmission structures 42 may be the same as an electrical connection approach between the first touch electrodes 10 and the first signal transmission structures 41. Similarly, when the second touch electrodes 20 include sub-electrodes, the electrical connection approach between the second touch electrodes 20 and the second signal transmission structures 42 may also be the same as the electrical connection approach between the first touch electrodes 10 and the first signal transmission structures 41.

Of course, according to an actual condition, the second signal transmission structures 42 and the first signal transmission structures 41 may also be not arranged in the same layer. For instance, the second signal transmission structures that are electrically connected with the second touch electrodes 20 may be simultaneously formed in a process of forming the second touch electrodes 20, so as to achieve the electrical connection between the second touch electrodes 20 and the touch chip. Embodiments of the present disclosure include but not limited thereto.

As shown in FIGS. 3a and 3b, the second section 32 of the insulating layer 30 makes direct contact with the first signal transmission structures 41. As shown in FIGS. 3c and 3d, the second section 32 of the insulating layer 30 may not make direct contact with the first signal transmission structures 41.

In a case that the part of the first touch electrode 10 that is electrically connected with the first signal transmission structure 41 is disposed on a side of the insulating layer 30 that is close to the base substrate 90, for instance, as shown in FIG. 3c, the part of the first touch electrode 10 that is electrically connected with the first signal transmission structure 41 may cover the first signal transmission structure 41. This can protect the first signal transmission structure 41 more adequately and reduce an adverse effect caused by the undercut phenomenon of the first signal transmission structure 41. In this case, for instance, the second section 32 of the insulating layer 30 may cover and make direct contact with the part of the first touch electrode 10.

In a case that the part of the first touch electrode 10 that is electrically connected with the first signal transmission structure 41 is disposed on another side of the insulating layer 30 that is away from the base substrate 90, for instance, as shown in FIG. 3d, when the conductive bridge 12 is disposed between the first section 31 of the insulating layer 30 and the base substrate 90, conductive connection members 70 may be disposed between the second section 32 of the insulating layer 30 and the base substrate 90. The conductive connection members 70 cover and are electrically connected with the first signal transmission structures 41. That is, a conductive connection member 70 is disposed on a side of a corresponding first signal transmission structure 41 that is away from the base substrate 90 and makes direct contact with the first signal transmission structure 41. The conductive connection members 70 are arranged in the same layer with the conductive bridge 12 of the first touch electrode 10. That is, the conductive connection members 70 are formed by a layer for forming the conductive bridges 12.

Figure 5A:
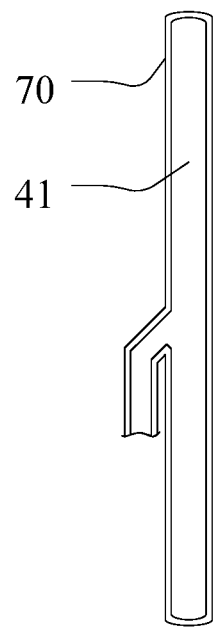
FIG. 5a is a schematic top view of a conductive connection member that covers a first signal transmission structure in an embodiment of the present disclosure.
Figure 5B:
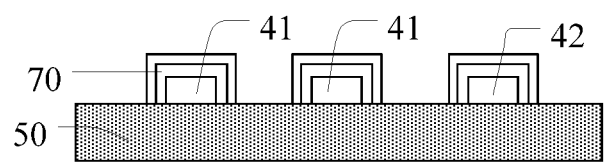
FIG. 5b is a schematic sectional view of the touch structure along a C'C' line in FIG. 2 provided by an embodiment of the present disclosure.

FIG. 5a is a schematic top view of an embodiment of the present disclosure in which a first signal transmission structure 41 is covered by a conductive connection member 70. FIG. 5b is a schematic sectional view of positions where the first signal transmission structures 41 are electrically connected with the touch chip (that is, bonding positions) in an embodiment of the present disclosure. As shown in FIGS. 5a and 5b, a conductive connection member 70 covers and is electrically connected with a corresponding first signal transmission structure 41, so as to adequately protect the first signal transmission structure 41 and avoid adverse effect caused by the undercut phenomenon of the first signal transmission structure 41 as much as possible. Moreover, as the conductive connection members 70 are arranged in the same layer with the conductive bridges 12, the arrangement of the conductive connection members 70 does not need an additional manufacturing process. Of course, as shown in FIG. 5b, retaining parts (not shown in the figure) of a layer for forming the sub-electrodes 11 of the first touch electrodes 10 and the second touch electrodes 20 may also be disposed on the conductive connection members 70.

As the conductive bridges 12 are generally made from materials such as conductive metal oxide and the conductive connection members 70 are arranged in the same layer with the conductive bridges 12, the forming material of the conductive connection member 70 may also include conductive metal oxide, for instance, at least one of materials including ITO, IGZO, IZO, etc. When the conductive bridges 12 are made from metal, the material of the conductive connection members 70 may also change correspondingly. Compared with metallic materials, the first signal transmission structures 41 can be better protected from being oxidized when the conductive bridges are made from the conductive metal oxide, and it is ensured that the first signal transmission structures 41 can be electrically connected with the first touch electrodes 10 through the conductive connection members 70.

Description is given in the above embodiments by taking the case that the touch structure adopts the conductive bridge touch structure as an example. Of course, the touch structure provided by embodiments of the present disclosure may also adopt a non-conductive bridge touch structure commonly used in the art, as long as the insulating layer 30 is disposed between the first touch electrodes 10 and the second touch electrodes 20 and configured to insulate the first touch electrodes from the second touch electrodes at positions where the first touch electrodes 10 intersects with the second touch electrodes 20.

Figure 6A:
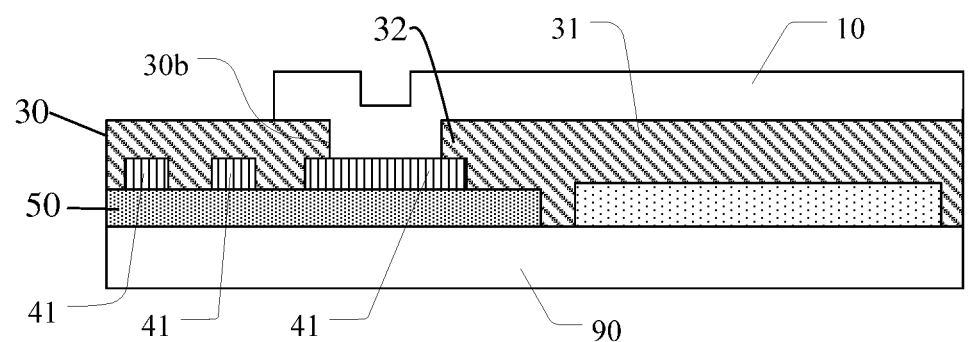
FIGS. 6a to 6d are schematic sectional views a non-conductive bridge touch structure along a B'B' line in FIG. 2 provided by an embodiment of the present disclosure.
Figure 6B:
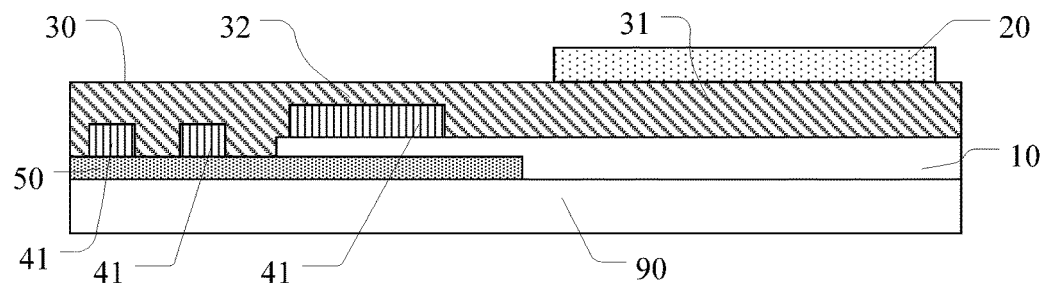
Figure 6C:
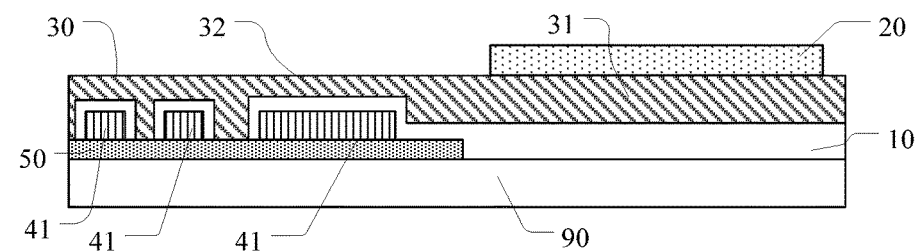
Figure 6D:
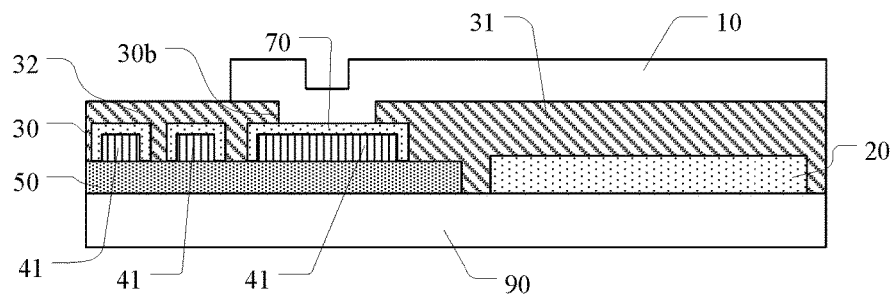

For instance, as shown in FIGS. 6a to 6d, one of the first touch electrode 10 and the second touch electrode 20 may be disposed between the insulating layer 30 and the base substrate 90, and the other of the first touch electrode 10 and the second touch electrode 20 is disposed on a side of the insulating layer 30 that is away from the base substrate 90. That is to say, the first touch electrode 10 may be disposed on a side of the insulating layer 30 that is away from the base substrate 90 (as shown in FIGS. 6a and 6d); or, the first touch electrode 10 may be disposed on a side of the insulating layer 30 that is close to the base substrate 90 and may be arranged between the first signal transmission structure 41 and the base substrate 90 (as shown in FIG. 6b); or, the first touch electrode 10 may be disposed on a side of the insulating layer 30 that is close to the base substrate 90 and may be arranged between the insulating layer 30 and the first signal transmission structure 41 (as shown in FIG. 6c).

In order to more adequately protect the first signal transmission structures 41 and reduce the adverse effect caused by the undercut phenomenon of the first signal transmission structures 41, for instance, the first signal transmission structures 41 may be further protected by the following ways.

For instance, as shown in FIG. 6c, the first touch electrode 10 is disposed between the second section 32 of the insulating layer 30 and the first signal transmission structure 41; and the first touch electrode 10 covers the first signal transmission structure 41. In this case, the second section 32 of the insulating layer 30 covers the part of the first touch electrode 10 and makes direct contact with the first touch electrode 10.

Or, for instance, as shown in FIG. 6d, when the first touch electrode 10 is disposed on a side of the insulating layer 30 that is away from the base substrate 90, a conductive connection member 70 may also be disposed between the second section 32 of the insulating layer 30 and the base substrate 90. The conductive connection member 70 covers and is electrically connected with the corresponding first signal transmission structure 41, that is, the conductive connection member 70 is disposed on a side of the first signal transmission structure 41 that is away from the base substrate 90 and the conductive connection member 70 makes direct contact with the first signal transmission structure 41. The conductive connection member 70 is arranged in the same layer with the second touch electrode 20.

In the touch structure as shown in FIGS. 6a to 6d, as the first touch electrode 10 and the second touch electrode 20 are disposed on two sides of the insulating layer 30 respectively, signal wiring approaches of the first touch electrodes 10 and the second touch electrodes 20 are different. For instance, when the first touch electrode 10 and the first signal transmission structure 41 are electrically connected by the approach as shown in FIG. 6a or FIG. 6d, the second touch electrode 10 may be electrically connected with the second signal transmission structure (including at least one of a wire and a contact pad) by, for instance, the approach as shown in FIG. 6b or 6c, so as to be electrically connected with the touch chip. Or, for instance, when the first touch electrode 10 and the first signal transmission structure 41 are electrically connected by the approach as shown in FIG. 6b or 6c, the second touch electrode 10 may be electrically connected with the second signal transmission structure by, for instance, the approach as shown in FIG. 6a or 6d. Or, for instance, the second signal transmission structure that is electrically connected with the second touch electrode 20 may be simultaneously formed in a process of forming the second touch electrode 20. Embodiments of the present disclosure include but not limited thereto.

In the touch structure as shown in FIGS. 6a to 6d, the settings of various components may be understood with reference to relevant description in the bridge touch structure as shown in FIGS. 3a to 3d. No further description will be given here.

A top view of the touch structure provided by embodiments of the present disclosure may be similar to that as shown in FIG. 1a. Therefore, embodiments of the present disclosure do not provide relevant drawings further.

The touch structure provided by embodiments of the present disclosure not only can be applied in an OGS touch panel but also can be applied in a multi-layer on-cell (MLOC) touch panel. In the OGS touch panel, as shown in FIGS. 3a to 3d and FIGS. 6a to 6d, a black matrix (BM) layer 50 may also be disposed at positions of the base substrate 90 that correspond to the first signal transmission structures 41. In the MLOC touch panel, the BM layer is not required to be formed on the base substrate 90.

At least one embodiment of the present disclosure further provides a touch substrate, which comprises the touch structure provided by any foregoing embodiment.

At least one embodiment of the present disclosure further provides a display device, which comprises the foregoing touch substrate.

Figure 7A:
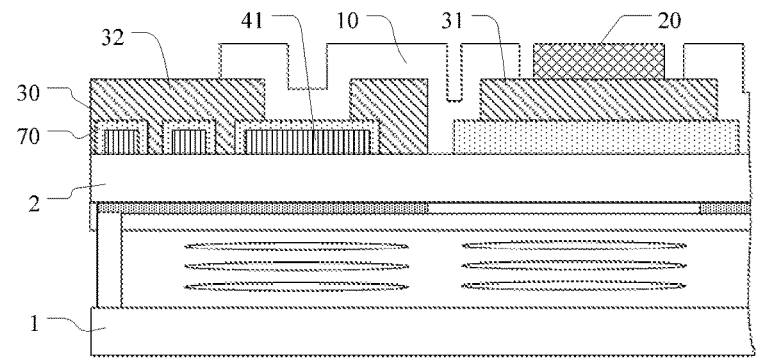
FIGS. 7a and 7b are schematic partial sectional views of a display device provided by an embodiment of the present disclosure.

For instance, as shown in FIG. 7a, the display device may comprise an array substrate 1 and an opposing substrate 2 (e.g., a CF substrate) which are arranged opposite to each other, and the opposing substrate 2 may be the touch substrate provided by any foregoing embodiment.

Figure 7B:
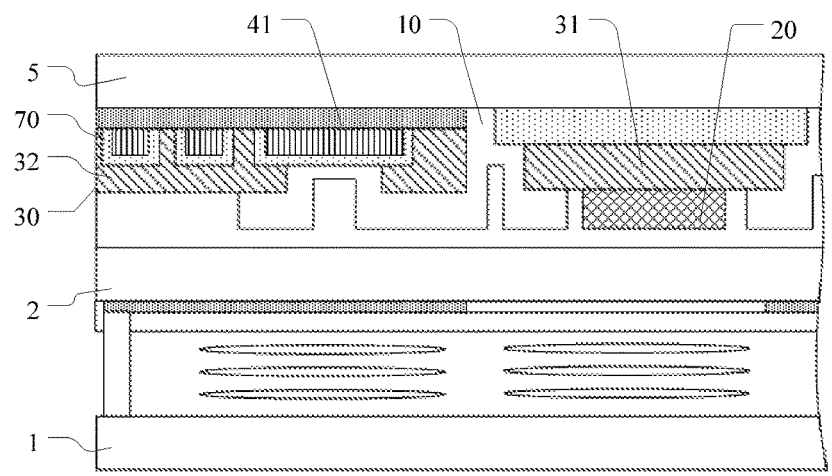

Or, as shown in FIG. 7b, the display device may comprise an array substrate 1 and an opposing substrate 2 which are arranged opposite to each other, and a protective substrate 5 disposed on a side of the opposing substrate that is away from the array substrate. The opposing substrate 2 may be taken as the touch substrate provided by any foregoing embodiment, and the touch structure may be disposed on a side of the opposing substrate 2 that is away from the array substrate 1. Or, the protective substrate 5 may be taken as the touch substrate provided by any foregoing embodiment.

Numerical references in FIGS. 7a and 7b are the same as the numerical references in the embodiments of the touch structure. No further description will be given here.

For instance, the display device may be: any product or component with a display function such as a liquid crystal display (LCD) panel, an e-paper, an organic light-emitting diode (OLED) display panel, a mobile phone, a tablet PC, a TV, a display, a notebook computer, a digital picture frame and a navigator.

At least one embodiment of the present disclosure further provides a method for manufacturing a touch structure. The method comprises: forming first touch electrodes and second touch electrodes on a base substrate, with the first touch electrodes and the second touch electrodes intersecting with each other; forming first signal transmission structures on the base substrate, in which the first signal transmission structures are electrically connected with the first touch electrodes; and forming an insulating film on the base substrate after forming the first signal transmission structures, and patterning the insulating film to form an insulating layer including first sections and second sections. The first sections are formed at positions where the first touch electrodes intersect with the second touch electrodes, and the first sections are disposed between the first touch electrodes and the second touch electrodes so as to insulate the first touch electrodes from the second touch electrodes, and the second sections cover the first signal transmission structures.

A patterning process includes operations for forming a specific pattern via a mask, for instance, including operations such as photoresist coating, exposure, development and etching. But implementation of the patterning process is not limited thereto. The patterning process may also include other operations capable of forming a specific pattern.

In the manufacturing method provided by embodiments of the present disclosure, the forming sequence of the first touch electrodes, the second touch electrodes and the insulating layer is not limited, as long as the first touch electrodes and the second touch electrodes are intersected with each other and insulated from each other by the insulating layer.

For instance, when a part of the first touch electrode that is electrically connected with the first signal transmission structure is disposed on a side of the insulating layer that is away from the base substrate, in the manufacturing method provided by an embodiment of the present disclosure, an insulating film may be patterned to form the insulating layer and at least one through hole disposed in the second section of the insulating layer. The first signal transmission structure is electrically connected with the first touch electrode through the at least one through hole.

For instance, the step of forming the first signal transmission structures may also include the step of forming second signal transmission structures, and the second signal transmission structures are electrically connected with the second touch electrodes respectively. In this case, the first signal transmission structures and the second signal transmission structures are arranged in the same layer.

For instance, as for the touch structure as shown in FIGS. 3d and 6d, the manufacturing method provided by at least one embodiment of the present disclosure may comprise the following steps S11 to S14. Detailed description will be given below to the steps with reference to FIGS. 8a to 8e.

Figure 8A:
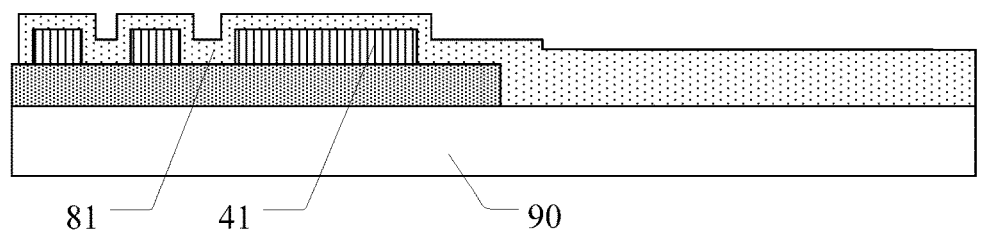
FIGS. 8a to 8e are schematic diagrams illustrating various processes of a manufacturing method of the touch structure as shown in FIG. 3d provided by an embodiment of the present disclosure.

S11: forming first signal transmission structures 41 on a base substrate 90, as shown in FIG. 8a. For instance, the first signal transmission structures 41 may be obtained by processes such as sputter coating, photoresist coating, exposure, development, etching and photoresist stripping, etc.

Figure 8B:
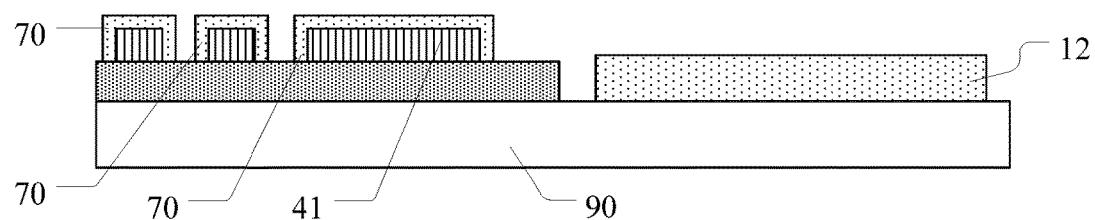

S12: forming a first conductive film 81 on the first signal transmission structures 41, as shown in FIG. 8a; and patterning the first conductive film 81 to form conductive connection members 70 which cover and are electrically connected with the first signal transmission structures 41, as shown in FIG. 8b.

For instance, the first conductive film may be made from conductive metal oxide. For instance, the conductive connection members 70 may be obtained by processes such as sputter coating, photoresist coating, exposure, development, etching and photoresist stripping, etc.

In this step, as for the touch structure as shown in FIG. 3d, a conductive bridge 12 is also simultaneously formed in the process of forming the conductive connection members 70, as shown in FIG. 8b; and as for the touch structure as shown in FIG. 6d, a second touch electrode is also simultaneously formed in the process of forming the conductive connection members 70.

Figure 8C:
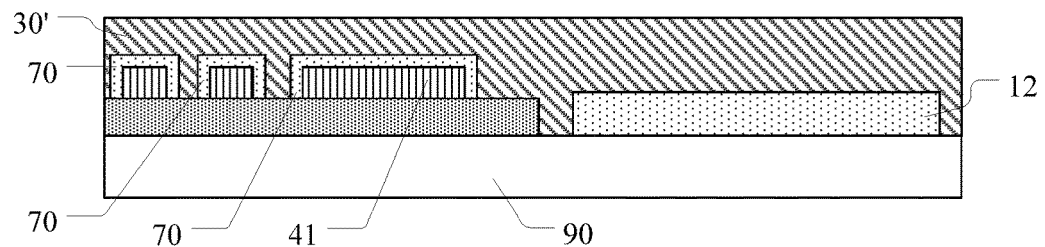
Figure 8D:
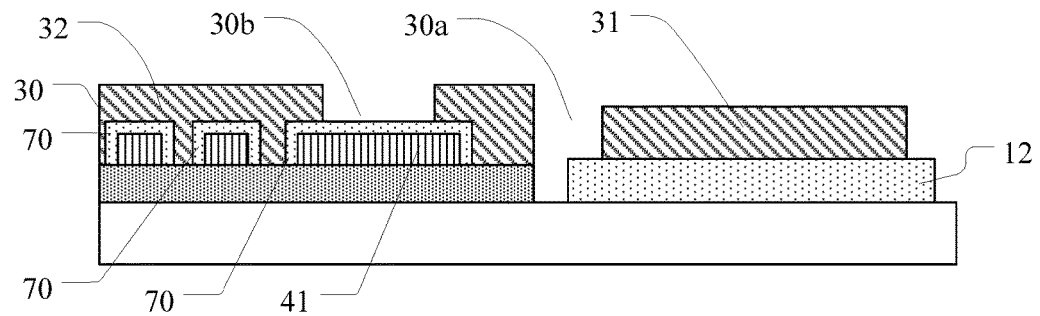

S13: forming an insulating film 30' on the conductive connection members 70, as shown in FIG. 8c; and subsequently, forming an insulating layer 30 by patterning the insulating film 30', as shown in FIG. 8d.

In this step, the insulating layer 30 includes a first section 31 and a second section 32, and the second section 32 is provided with at least one through hole 30b from which at least a partial surface of the conductive connection member 70 is exposed. As for the touch structure as shown in FIG. 3d, the insulating layer 30 is also provided with a plurality of through holes 30a from which partial surfaces of the conductive bridge 12 are exposed.

For instance, the insulating layer 30 may be formed by a patterning process including processes such as coating, exposure and development, etc.

Figure 8E:
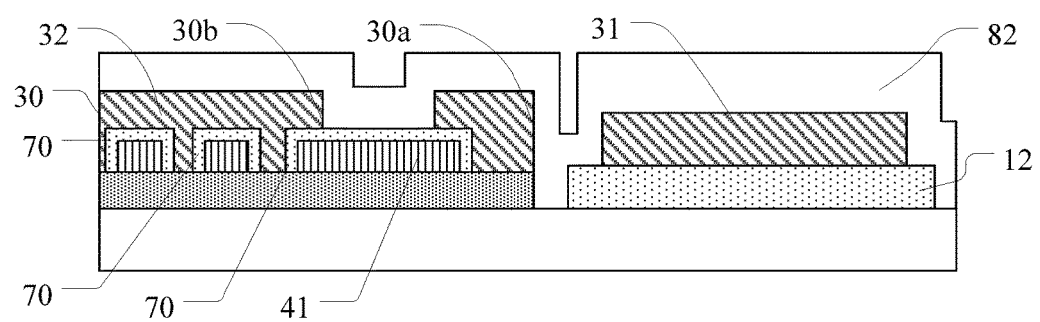

S14: forming a second conductive film 82 on the insulating layer 30, as shown in FIG. 8e; and forming at least a part of a first touch electrode 10 by patterning the second conductive film 82, as shown in FIG. 3d.

As for the touch structure as shown in FIG. 3d, the second touch electrode 20 and the sub-electrodes 11 of the first touch electrode 10 are formed in the step. A sub-electrode 11 is electrically connected with the first signal transmission structure 41 through the at least one through hole 30b, and two adjacent sub-electrodes 11 are electrically connected with the conductive bridge 12 via the through holes 30a in the insulating layer 30 to form the first touch electrode 10. As for the touch structure as shown in FIG. 6d, the first touch electrode is formed in this step.

For instance, the second conductive film may be made from conductive metal oxide. For instance, as similar to the step S12, the step S14 may include the processes such as sputter coating, photoresist coating, exposure, development, etching and photoresist stripping, etc.

For instance, as for the touch structure as shown in FIGS. 3c and 6c, the manufacturing method provided by at least one embodiment of the present disclosure may comprise the following steps S21 to S24. Detailed description will be given below to the steps with reference to FIGS. 9a to 9e.

Figure 9A:
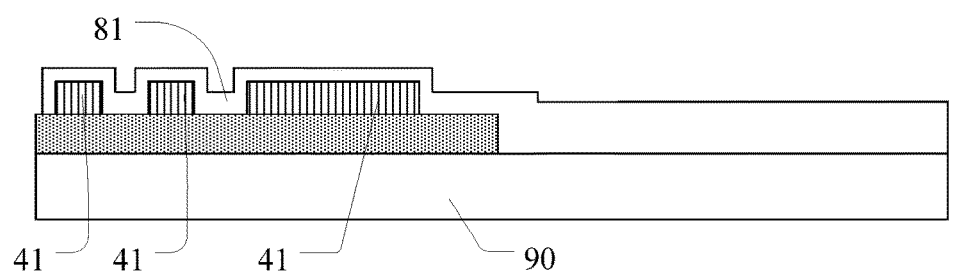
FIGS. 9a to 9e are schematic diagrams illustrating various processes of a manufacturing method of the touch structure as shown in FIG. 3c provided by an embodiment of the present disclosure.

S21: forming first signal transmission structures 41 on a base substrate 90, as shown in FIG. 9a.

Figure 9B:
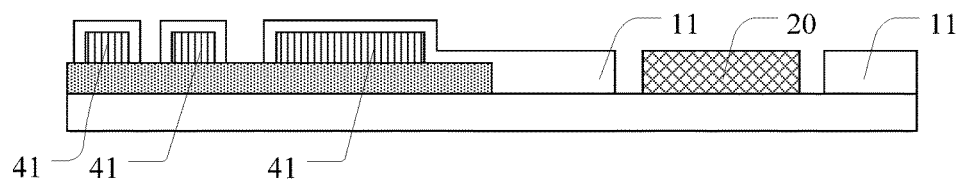

S22: forming a first conductive film 81 on the first signal transmission structures 41, as shown in FIG. 9a; and forming at least one part of a first touch electrode 10 by patterning the first conductive film 81, as shown in FIG. 9b.

As for the touch structure as shown in FIG. 3c, the second touch electrode 20 and sub-electrodes 11 of the first touch electrode 10 are formed in this step, and the sub-electrodes 11 cover and are electrically connected with a corresponding first signal transmission structure 41. As for the touch structure as shown in FIG. 6c, the first touch electrode is formed in the step.

Figure 9C:
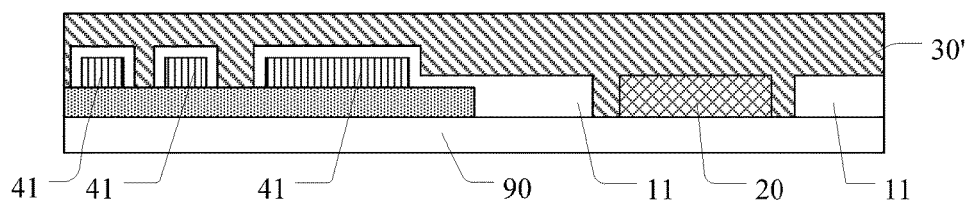
Figure 9D:
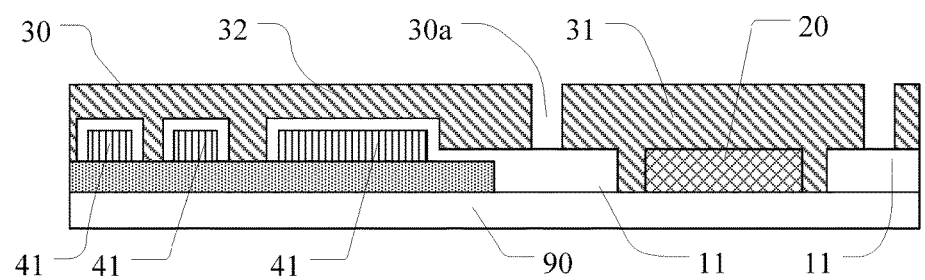

S23: forming an insulating film 30' on the at least one part of the first touch electrode 10, as shown in FIG. 9c; and subsequently, forming an insulating layer 30 by patterning the insulating film 30', as shown in FIG. 9d.

In the step, the insulating layer 30 covers the at least one part of the first touch electrode 10. As for the touch structure as shown in FIG. 3c, the insulating layer 30 is provided with a plurality of through holes 30a from which partial surfaces of the at least one part of the first touch electrode 10 are exposed.

Figure 9E:
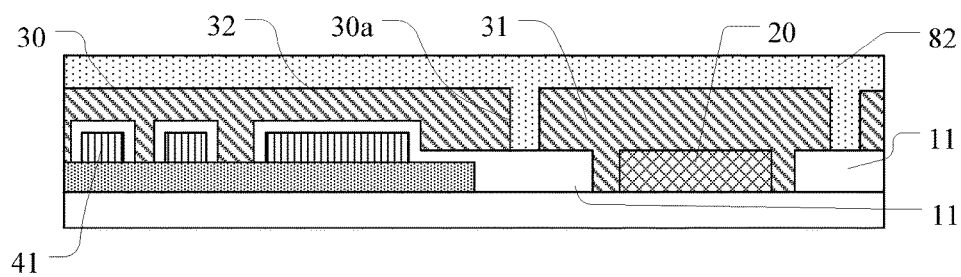

S24: forming a second conductive film 82 on the insulating layer 30, as shown in FIG. 9e; and subsequently, patterning the second conductive film 82.

As for the case as shown in FIG. 3c, a conductive bridge 12 is formed in the step, and two adjacent sub-electrodes 11 are electrically connected with each other through the conductive bridge 12 via the through holes 30a of the insulating layer 30, so as to form the first touch electrode 10. As for the case as shown in FIG. 6c, the second touch electrode is formed in the step.

In the steps S21 to S24, the patterning processes of the films may be understood with reference to the description in the steps S11 to S14. No further description will be given here.

For instance, as for the touch structure as shown in FIGS. 3b and 6b, the manufacturing method provided by at least one embodiment of the present disclosure may comprise the following steps S31 to S34. Detailed description will be given below to the steps with reference to FIGS. 10a to 10f.

Figure 10A:
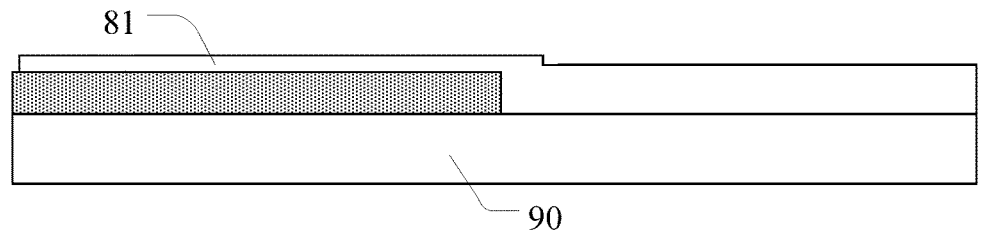
FIGS. 10a to 10f are schematic diagrams illustrating various processes of a manufacturing method of the touch structure as shown in FIG. 3b provided by an embodiment of the present disclosure.
Figure 10B:
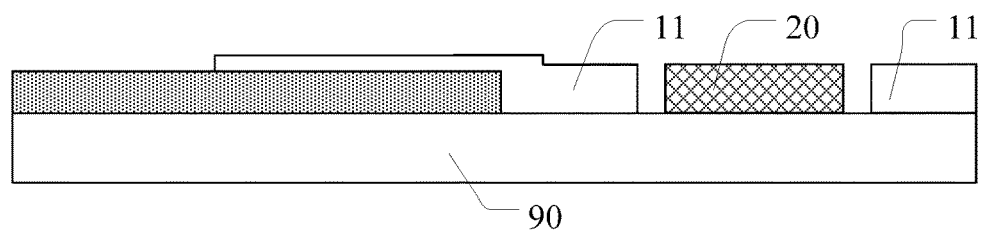

S31: forming a first conductive film 81 on a base substrate 90, as shown in FIG. 10a; and subsequently, forming at least one part of a first touch electrode 10 by patterning the first conductive film 81, as shown in FIG. 10b.

As for the touch structure as shown in FIG. 3b, the second touch electrode 20 and the sub-electrodes 11 of the first touch electrode 10 are formed in the step. As for the touch structure as shown in FIG. 6b, the first touch electrode is formed in the step.

Figure 10C:
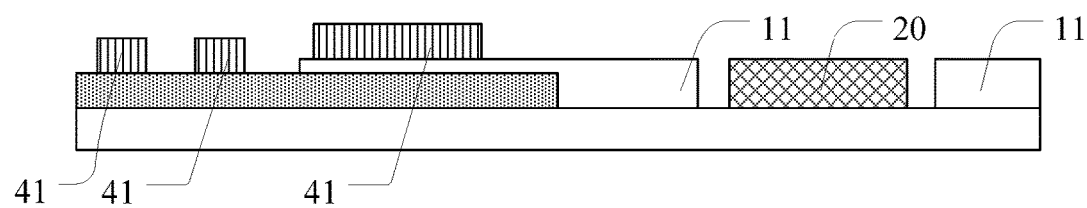

S32: forming first signal transmission structures 41 on the at least one part of the first touch electrode 10, as shown in FIG. 10c.

Figure 10D:
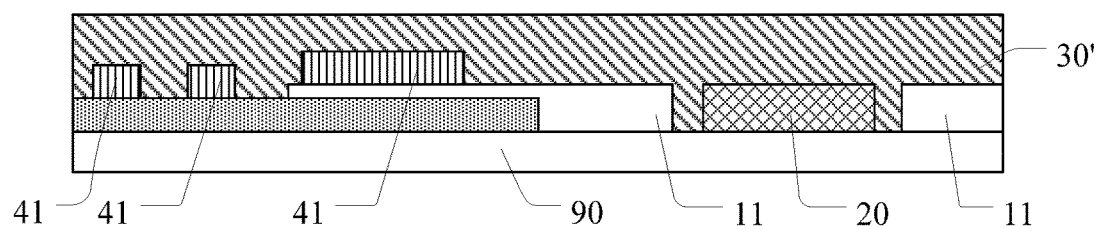
Figure 10E:
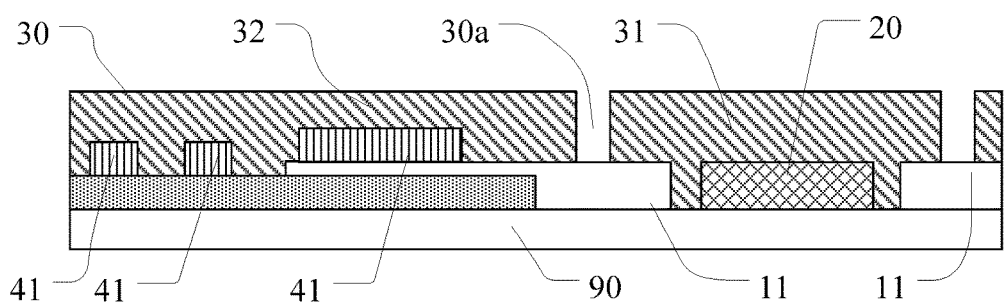

S33: forming an insulating film 30' on the first signal transmission structures 41, as shown in FIG. 10d; and subsequently, forming an insulating layer 30 by patterning the insulating film 30', as shown in FIG. 10e.

In the step, the insulating layer 30 covers the at least one part of the first touch electrode 10 and the first signal transmission structures 41. As for the touch structure as shown in FIG. 3b, the insulating layer 30 is provided with a plurality of through holes 30a from which partial surfaces of the at least one part of the first touch electrode 10 are exposed.

Figure 10F:
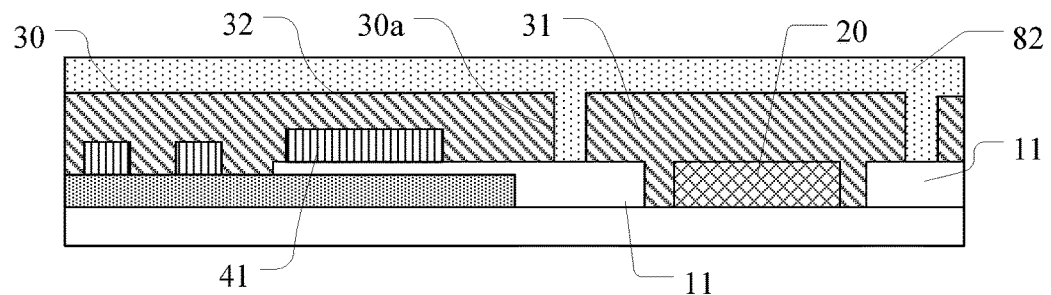

S34: forming a second conductive film 82 on the insulating layer 30, as shown in FIG. 10f; and subsequently, patterning the second conductive film.

As for the case as shown in FIG. 3b, a conductive bridge 12 is formed in the step, and two adjacent sub-electrodes 11 are electrically connected with each other through the conductive bridge 12 via the through holes 30a of the insulating layer 30, so as to form the first touch electrode 10. As for the case as shown in FIG. 6b, the second touch electrode is formed in the step.

In the steps S31 to S34, the manufacturing processes of the films may be understood with reference to the description in the steps S11 to S14. No further description will be given here.

Description is given in the above manufacturing methods by only taking FIGS. 3b to 3d and FIGS. 6b to 6d as an example. Embodiments of the present disclosure include but not limited thereto. For instance, in the conductive bridge structure, each first touch electrode may also be continuously formed, and each second touch electrode includes conductive bridges and sub-electrodes. In this case, compared with the method for manufacturing the touch structure as shown in FIGS. 3b to 3d, patterns obtained by patterning the first conductive film and the second conductive film will also change correspondingly.

Of course, the manufacturing method provided by embodiments of the present disclosure may be used for manufacturing an OGS touch panel and an MLOC touch panel. When used for manufacturing the OGS touch panel, the manufacturing method provided by embodiments of the present disclosure may further comprise the step of forming a BM layer. In this case, the manufacturing method provided by embodiments of the present disclosure is a 5-mask process, and one mask process is reduced compared with the common 6-mask process. When used for manufacturing the on-cell touch panel, the manufacturing method may not comprise the step of forming the BM layer. In this case, the manufacturing method provided by embodiments of the present disclosure is a 4-mask process. Of course, embodiments of the present disclosure include but not limited thereto.

In summary, the touch structure, the manufacturing method thereof, the touch substrate and the display device, provided by embodiments of the present disclosure, have the following advantages: firstly, as the insulating layer between the first touch electrodes and the second touch electrodes is adopted to cover the first signal transmission structures, not only the first signal transmission structures can be effectively protected (for instance, the first signal transmission structures are prevented from being oxidized or scratched), but also a step of independently forming an insulating layer for protecting the first signal transmission structures can be saved, and hence one mask can be saved; secondly, as the first signal transmission structures are made from metallic materials and the first and second touch electrodes are made from metal oxide materials, the approach of adopting the materials of the first and second touch electrodes to expand outwards to form the first signal transmission structures can adequately protect the first signal transmission structures and avoid poor signal transmission caused by the undercut phenomenon of the first signal transmission structures as much as possible; and thirdly, as a first signal transmission structure and a first touch electrode are eclectically connected with each other via a plurality of through holes, compared with the approach of adopting one through hole, the overall disconnection caused by the peeling of the first touch electrode at the through hole can be prevented.

In the accompanying drawings of embodiments of the present disclosure, the thickness and the shape of the films do not reflect the actual scale and are only intended to illustrate the content of embodiments of the present disclosure.

What are described above is related to the illustrative embodiments of the disclosure only and not limitative to the scope of the disclosure. The scopes of the disclosure are defined by the accompanying claims.

The present application claims the priority of the Chinese Patent Application No. 201510597119.6 filed on Sep. 18, 2015, which is incorporated herein by reference in its entirety as part of the disclosure of the present application.

What is claimed is:

1. A touch structure, comprising:
a base substrate;
an insulating layer disposed on the base substrate;
a first touch electrode and a second touch electrode that are disposed on the base substrate and intersect with each other, wherein the insulating layer includes a first section, the first section is disposed at a position where the first touch electrode intersects with the second touch electrode, and the first section is arranged between the first touch electrode and the second touch electrode to insulate the first touch electrode from the second touch electrode;

a first signal transmission structure disposed on the base substrate, wherein the insulating layer further includes a second section arranged in a same layer as the first section, and the second section covers the first signal transmission structure; and a conductive connection member, which completely covers an upper surface and lateral surfaces of the first signal transmission structure and is electrically connected with the first signal transmission structure, wherein the first signal transmission structure is electrically connected with the first touch electrode via the conductive connection member;

one of the first touch electrode and the second touch electrode includes at least a conductive bridge and a plurality of sub-electrodes that are disposed separately, two adjacent sub-electrodes are electrically connected with each other through one conductive bridge, and the conductive bridge is disposed at the position where the first touch electrode intersects with the second touch electrode;

the other of the first touch electrode and the second touch electrode is arranged in a same layer with the plurality of sub-electrodes while being arranged in a different layer from the conductive bridge; and the conductive bridge is disposed between the first section of the insulating layer and the base substrate, and the conductive connection member is arranged in a same layer with the conductive bridge, the conductive connection member and the conductive bridge are formed by a same film layer.

2. The touch structure according to claim 1, wherein:
the first touch electrode includes a part that is electrically connected with the first signal transmission structure and arranged on a side of the insulating layer away from the base substrate.

3. The touch structure according to claim 2, wherein the second section of the insulating layer is provided with at least one through hole, and the first signal transmission structure is electrically connected with the first touch electrode via the at least one through hole.

4. The touch structure according to claim 1, wherein the conductive connection member makes direct contact with the first signal transmission structure.

5. The touch structure according to claim 1, wherein the second section of the insulating layer makes direct contact with the first signal transmission structure.

6. The touch structure according to claim 1, wherein a forming material of the first signal transmission structure includes metal.

7. The touch structure according to claim 1, further comprising a second signal transmission structure, wherein the second signal transmission structure is electrically connected with the second touch electrode and is arranged in a same layer with the first signal transmission structure.

8. A touch substrate, comprising the touch structure according to claim 1.

9. A display device, comprising the touch substrate according to claim 8.

10. The display device according to claim 9, wherein:
the display device comprises an array substrate and an opposing substrate which are arranged opposite to each other, the opposing substrate serves as the touch substrate, and the touch structure is disposed on a side of the opposing substrate that is away from the array substrate; or the display device comprises an array substrate and an opposing substrate which are arranged opposite to each other, and a protective substrate disposed on the side of the opposing substrate that is away from the array substrate, the opposing substrate serves as the touch substrate, and the touch structure is disposed on the side of the opposing substrate that is away from the array substrate; or the protective substrate serves as the touch substrate.

11. A manufacturing method for a touch structure, comprising:
forming, on a base substrate, a first touch electrode and a second touch electrodes which intersect with each other, wherein one of the first touch electrode and the second touch electrode includes at least a conductive bridge and a plurality of sub-electrodes that are disposed separately, two adjacent sub-electrodes are electrically connected with each other through one conductive bridge, and the conductive bridge is disposed at the position where the first touch electrode intersects with the second touch electrode, the other of the first touch electrode and the second touch electrode is arranged in a same layer with the plurality of sub-electrodes while being arranged in a different layer from the conductive bridge;

forming a first signal transmission structure on the base substrate, wherein the first signal transmission structure is electrically connected with the first touch electrode;

forming a first conductive film on the first signal transmission structure and patterning the first conductive film to form a conductive connection member, wherein the conductive connection member completely covers an upper surface and lateral surfaces of the first signal transmission structure and is electrically connected with the first signal transmission structure, the first signal transmission structure is electrically connected with the first touch electrode via the conductive connection member, and the conductive connection member is arranged in a same layer with the conductive bridge, the conductive connection member and the conductive bridge are formed by a same film layer; and forming an insulating film after forming the first signal transmission structure and the conductive connection member, and patterning the insulating film to form an insulating layer including a first section and a second section, wherein the first section is formed at a position where the first touch electrode intersects with the second touch electrode, the first section is disposed between the first touch electrode and the second touch electrode to insulate the first touch electrode from the second touch electrode, the second section covers the first signal transmission structure, and the conductive bridge is disposed between the first section of the insulating layer and the base substrate.

12. The manufacturing method according to claim 11, wherein:
the insulating film is patterned to form the insulating layer and at least one through hole disposed in the second section of the insulating layer, and the first signal transmission structure is electrically connected with the first touch electrode via the at least one through hole.

13. The manufacturing method according to claim 11, wherein:

the insulating layer is formed on the conductive connection member; and a second conductive film is formed on the insulating layer and is patterned to form at least one part of the first touch electrode, wherein the first touch electrode and the second touch electrode are formed by the first conductive film and the second conductive film.

14. The manufacturing method according to claim 11, wherein the forming the first signal transmission structure includes forming a second signal transmission structure, and the second signal transmission structure is electrically connected with the second touch electrode.

15. A touch structure, comprising:

a base substrate;

an insulating layer disposed on the base substrate;

a first touch electrode and a second touch electrode that are disposed on the base substrate and intersect with each other, wherein the insulating layer includes a first section, the first section is disposed at a position where the first touch electrode intersects with the second touch electrode, and the first section is arranged between the first touch electrode and the second touch electrode to insulate the first touch electrode from the second touch electrode;

a first signal transmission structure disposed on the base substrate, wherein the insulating layer further includes a second section arranged in a same layer as the first section, and the second section covers the first signal transmission structure;

a conductive connection member, which completely covers an upper surface and lateral surfaces of the first signal transmission structure and is electrically connected with the first signal transmission structure, wherein the first signal transmission structure is electrically connected with the first touch electrode via the conductive connection member;

the first touch electrode is disposed on a side of the insulating layer that is away from the base substrate, and the second touch electrode is disposed between the insulating layer and the base substrate; and the conductive connection member is arranged in a same layer with the second touch electrode, and the conductive connection member and the second touch electrode are formed by a same film layer.

* * * * *